US011163343B1

(12) United States Patent
Lin et al.

(10) Patent No.: US 11,163,343 B1
(45) Date of Patent: Nov. 2, 2021

(54) FLEXIBLE POWER SUPPLY UNIT (PSU) BAY (71) Applicant: Dell Products, L.P., Round Rock, TX (US)

(72) Inventors: Chun-Cheng Lin, New Taipei (TW); Yu-Lin Chen, New Taipei (TW); Yueh-Chun Tsai, Taipei (TW); Jen-Chun Hsueh, Kaohsiung (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 17/012,124

(22) Filed: Sep. 4, 2020

(51) Int. Cl.
G06F 1/18 (2006.01)
H05K 7/14 (2006.01)

(52) U.S. Cl.
CPC .......... *G06F 1/188* (2013.01); *H05K 7/1492* (2013.01)

(58) Field of Classification Search
CPC .............................. G06F 1/188; H05K 7/1492
See application file for complete search history.

(56) References Cited

U.S. PATENT DOCUMENTS

| | | | | |
|---|---|---|---|---|
| 5,584,396 A * | 12/1996 | Schmitt | H02B 1/36 | 211/26 |
| 5,682,291 A * | 10/1997 | Jeffries | G06F 1/184 | 312/223.2 |
| 5,683,159 A * | 11/1997 | Johnson | G06F 1/184 | 312/223.2 |
| 5,717,571 A * | 2/1998 | Helot | G06F 1/1616 | 361/679.57 |
| 5,790,372 A * | 8/1998 | Dewey | G06F 1/189 | 312/223.2 |
| 6,075,698 A * | 6/2000 | Hogan | H05K 7/20581 | 165/104.34 |
| 6,587,348 B2 * | 7/2003 | Kondo | G06K 13/0806 | 361/741 |
| 6,619,766 B1 * | 9/2003 | Mansueto | G06F 1/184 | 312/223.1 |
| 6,685,503 B1 * | 2/2004 | Huang | G06F 1/184 | 361/727 |
| 7,137,767 B2 * | 11/2006 | Franke | F16F 1/3732 | 411/401 |
| 7,382,624 B2 * | 6/2008 | Barsun | G06F 1/26 | 174/50 |
| 7,477,512 B2 * | 1/2009 | Sung | G11B 33/123 | 361/679.33 |
| 7,929,289 B2 * | 4/2011 | Tseng | G11B 33/124 | 361/679.39 |
| 2004/0169996 A1 * | 9/2004 | Paul | G11B 33/126 | 361/679.37 |
| 2009/0279244 A1 * | 11/2009 | Crippen | G11B 33/123 | 361/679.33 |
| 2011/0103000 A1 * | 5/2011 | Sun | G11B 33/124 | 361/679.33 |

\* cited by examiner

Primary Examiner — Adrian S Wilson
(74) Attorney, Agent, or Firm — Fogarty LLP (57) ABSTRACT

Systems and methods for a flexible Power Supply Unit (PSU) bay are described. In some embodiments, a chassis may include a surface and a PSU adaptor disposed on the surface, the PSU adaptor comprising a tab having a stopper coupled thereto, where the stopper is configured to: (a) resist movement, bending, or deformation of a board perpendicularly disposed with respect to the surface upon insertion of a first PSU into a PSU cage, and (b) move downward upon insertion of a second PSU into the PSU cage.

18 Claims, 8 Drawing Sheets

FLEXIBLE POWER SUPPLY UNIT (PSU) BAY

FIELD

This disclosure relates generally to Information Handling Systems (IHSs), and more specifically, to a flexible Power Supply Unit (PSU) bay.

BACKGROUND

As the value and use of information continue to increase, individuals and businesses seek additional ways to process and store it. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as servers that are installed within chassis and stacked within slots provided by racks. A data center may include large numbers of such racks that may be organized into rows in a manner that allows administrators to access IHS components via the front and back of a rack. In some instances, administrators may be able to service and replace components of a rack-mounted IHS while the IHS remains operational and installed within the rack. Such replaceable components may be referred to as being hot-pluggable. An administrator may also be able to re-configure aspects of the operation of a rack-mounted IHS through the coupling and de-coupling of cables to the various connectors that may be provided on the back of a chassis of an IHS. In other instances, administrators may remove an IHS from operation in order to service or replace some of its internal components.

One such internal component is the Power Supply Unit (PSU). A PSU converts mains AC to low-voltage regulated DC power usable by other components of an IHS. There are different types of PSUs, each different type of PSU having its own form factor (e.g., physical dimensions, types and location of connectors, types and locations of cables, ejection mechanisms, etc.). For example, certain types of PSUs may require the use of a Power Distribution Board (PDB)— e.g., redundant PSUs—while others do not—e.g., cabled PSUs.

The inventors hereof have recognized that a PDB (or its board retention structure) often cannot withstand the insertion force during the installation of redundant PSUs, resulting in incomplete insertion of the PSU (the golden finger card edge pushes the PDB further into the chassis instead of being properly inserted into the PDB connector) and/or PDB deformation, introducing connectivity issues that impact the reliability of the product.

Accordingly, to facilitate the installation of different types of PSUs in the same IHS chassis or enclosure, the inventors hereof have developed various embodiments of a flexible PSU bay as described herein.

SUMMARY

Embodiments of systems and methods for a flexible Power Supply Unit (PSU) bay are described. In an illustrative, non-limiting embodiment, a chassis may include a surface and a PSU adaptor disposed on the surface, the PSU adaptor comprising a tab having a stopper coupled thereto, where the stopper is configured to: (a) resist movement, bending, or deformation of a board perpendicularly disposed with respect to the surface upon insertion of a first PSU into a PSU cage, and (b) move downward upon insertion of a second PSU into the PSU cage.

In some cases, the first PSU may include a redundant PSU, and the second PSU may include a cabled PSU. The surface may include a metal surface, and the stopper may include a plastic stopper.

The second PSU may include a fastening bar configured to push the tab and the stopper downward upon insertion of the second PSU into the PSU cage. The PSU adaptor may further include at least one pin configured to stop the second PSU upon insertion into the PSU cage at a position where the fastening bar attaches to the surface. Moreover, stopper may be configured to provide electrical insulation between the surface and the second PSU upon insertion into the PSU cage.

In another illustrative, non-limiting embodiment, a PSU adaptor may include a tab and a stopper coupled to the tab, where the stopper is configured to resist movement, bending, or deformation of a board upon insertion of a first PSU into a PSU cage. In yet another illustrative, non-limiting embodiment, a PSU adaptor may include a tab and a stopper coupled to the tab, where the tab and the stopper are configured to move downward upon insertion of a first PSU into a PSU cage.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. It should be appreciated that although certain IHSs described herein may be discussed in the context of enterprise computing servers, other embodiments may be utilized.

In a data center environment, an IHS may be installed within a chassis along with other similar IHSs. A rack may house multiple such chassis and a data center may house numerous racks. Each rack may host a large number of IHSs that are installed as components of a chassis and multiple chassis are stacked and installed within racks. In certain instances, the rear or back-side of such rack-mounted chassis may include one or more bays that each receive an individual replaceable component, such as a Power Supply Unit (PSU).

Figure 1:
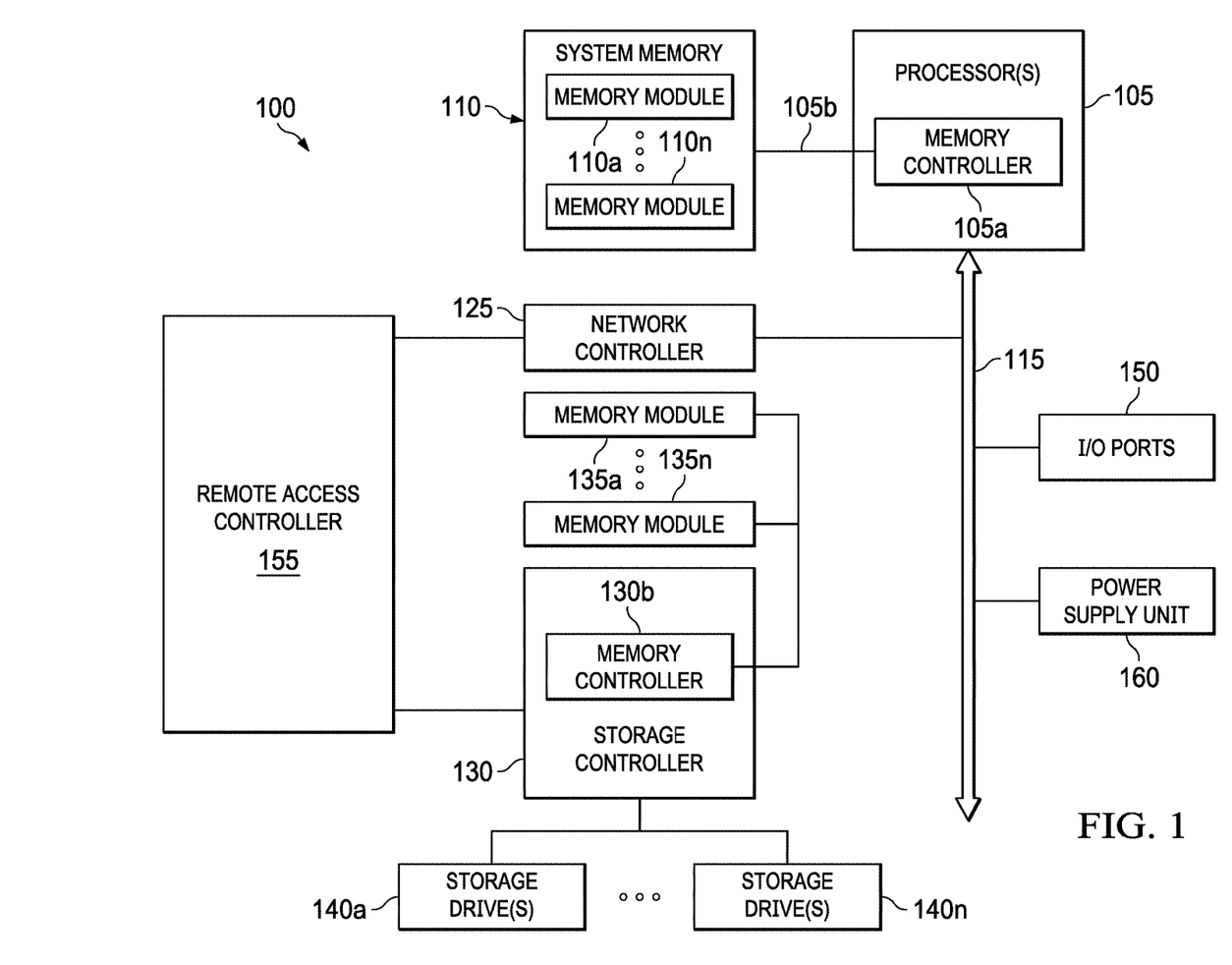
FIG. 1 is a diagram illustrating example components of an IHS for use in a rack-mounted chassis having a flexible Power Supply Unit (PSU) bay, according to some embodiments.

FIG. 1 illustrates example components of IHS 100 for use in a rack-mounted chassis having a flexible PSU bay. Although this example IHS 100 is described as a rack-mounted server, other implementations may use other types of IHSs. In this embodiment, IHS 100 may be a server installed within a chassis, which in turn is installed within one or more slots of a rack. In this manner, IHS 100 may utilize certain shared resources provided by the chassis and/or rack, such as power and networking. In some embodiments, multiple servers such as IHS 100 may be installed within a single chassis.

IHS 100 may include one or more processor(s) 105. In some embodiments, processor(s) 105 may include a main processor and a co-processor, each of which may include a plurality of processing cores. As illustrated, processor(s) 105 may include integrated memory controller 105a that may be implemented directly within the circuitry of processor(s) 105, or memory controller 105a may be a separate integrated circuit that is located on the same die as processor(s) 105. Memory controller 105a may be configured to manage the transfer of data to and from system memory 110 of IHS 100 via high-speed memory interface 105b.

System memory 110 may include memory components, such as such as static RAM (SRAM), dynamic RAM (DRAM), NAND Flash memory, suitable for supporting high-speed memory operations by processor(s) 105. System memory 110 may combine both persistent, non-volatile memory and volatile memory.

In certain embodiments, system memory 110 may include multiple removable memory modules. System memory 110 includes removable memory modules 110a-n. Each of removable memory modules 110a-n may utilize a form factor corresponding to a motherboard expansion card socket that receives a type of removable memory module 110a-n, such as a DIMM (Dual In-line Memory Module). Other embodiments of system memory 110 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 100 may operate using a chipset that may be implemented by integrated circuits that couple processor(s) 105 to various other components of the motherboard of IHS 100. In some embodiments, all or portions of the chipset may be implemented directly within the integrated circuitry of an individual one of processor(s) 105. The chipset may provide the processor(s) 105 with access to a variety of resources accessible via one or more buses 115. Various embodiments may utilize any number of buses to provide the illustrated pathways provided by single bus 115. In certain embodiments, bus 115 may include a PCIe (PCI Express) switch fabric that is accessed via a root complex and coupled processor(s) 105 to a variety of internal and external PCIe devices.

In various embodiments, a variety of resources may be coupled to the processor(s) 105 of the IHS 100 via buses 115 managed by the processor chipset. In some cases, these resources may be components of the motherboard of IHS 100 or these resources may be resources coupled to IHS 100, such as via I/O ports 150. In some embodiments, IHS 100 may include one or more I/O ports 150, such as PCIe ports, that may be used to couple IHS 100 directly to other IHSs, storage resources or other peripheral components. In certain embodiments, I/O ports 150 may provide couplings to a backplane or midplane of the chassis in which the IHS 100 is installed. In some instances, I/O ports 150 may include rear-facing externally accessible connectors by which external systems and networks may be coupled to IHS 100.

As illustrated, IHS 100 may also include Power Supply Unit (PSU) 160 that provides the components of the chassis with appropriate levels of DC power. PSU 160 may receive power inputs from an AC power source or from a shared power system that is provided by a rack within which IHS 100 may be installed. In certain embodiments, PSU 160 may be implemented as a swappable component that may be used to provide IHS 100 with redundant, hot-swappable power supply capabilities. Moreover, PSU 160 may be installed within a flexible Power Supply Unit (PSU) bay as described herein.

Processor(s) 105 may also be coupled to network controller 125, such as provided by a Network Interface Controller (NIC) that is coupled to the IHS 100 and allows IHS 100 to communicate via an external network, such as the Internet or a LAN. Network controller 125 may include various microcontrollers, switches, adapters, and couplings used to connect IHS 100 to a network, where such connections may be established by IHS 100 directly or via shared networking components and connections provided by a rack in which chassis 100 is installed. In some embodiments, network controller 125 may allow IHS 100 to interface directly with network controllers from other nearby IHSs in support of clustered processing capabilities that utilize resources from multiple IHSs.

IHS 100 may include one or more storage controllers 130 that may be utilized to access storage drives 140a-n that are accessible via the chassis in which IHS 100 is installed. Storage controllers 130 may provide support for RAID (Redundant Array of Independent Disks) configurations of logical and physical storage drives 140a-n. In some embodiments, storage controller 155 may be an HBA (Host Bus Adapter) that provides limited capabilities in accessing physical storage drives 140a-n. In many embodiments, storage drives 140a-n may be replaceable, hot-swappable storage devices that are installed within bays provided by the chassis in which IHS 100 is installed. In some embodiments, storage drives 140a-n may also be accessed by other IHSs that are also installed within the same chassis as IHS 100. In various embodiments, storage drives 140a-n may include SAS (Serial Attached SCSI) magnetic disk drives, SATA (Serial Advanced Technology Attachment) magnetic disk drives, solid-state drives (SSDs) and other types of storage drives in various combinations.

As with processor(s) 105, storage controller 130 may also include integrated memory controller 130b that may be used to manage the transfer of data to and from one or more memory modules 135a-n via a high-speed memory interface. Through use of memory operations implemented by memory controller 130b and memory modules 135a-n, storage controller 130 may operate using cache memories in support of storage operations. Memory modules 135a-n may include memory components, such as such as static RAM (SRAM), dynamic RAM (DRAM), NAND Flash memory, suitable for supporting high-speed memory operations and may combine both persistent, non-volatile memory and volatile memory. As with system memory 110, memory modules 135a-n may utilize a form factor corresponding to a memory card socket, such as a DIMM (Dual In-line Memory Module).

IHS 100 includes a remote access controller (RAC) 155 that provides capabilities for remote monitoring and management of various aspects of the operation of IHS 100. In support of these monitoring and management functions, remote access controller 155 may utilize both in-band and sideband (i.e., out-of-band) communications with various internal components of IHS 100.

Remote access controller 155 may additionally implement a variety of management capabilities. In some instances, remote access controller 155 operate from a different power plane from processor(s) 105, storage drives 140a-n and other components of IHS 100, thus allowing remote access controller 155 to operate, and management tasks to proceed, while processor cores of IHS 100 are powered off. Various BIOS functions, including launching the operating system of IHS 100, may be implemented by remote access controller 155. In some embodiments, remote access controller 155 may perform various functions to verify the integrity of the IHS 100 and its hardware components prior to initialization of the IHS 100 (i.e., in a bare-metal state).

In various embodiments, an IHS may not include each of the components shown in FIG. 1. Additionally, or alternatively, an IHS may include various additional components in addition to those that are shown in FIG. 1. Furthermore, some components that are represented as separate components in FIG. 1 may in certain implementations be integrated with other components. For example, in certain embodiments, all or a portion of the functionality provided by the illustrated components may instead be provided by components integrated into one or more processor(s) 105 as a systems-on-a-chip.

Figure 2:
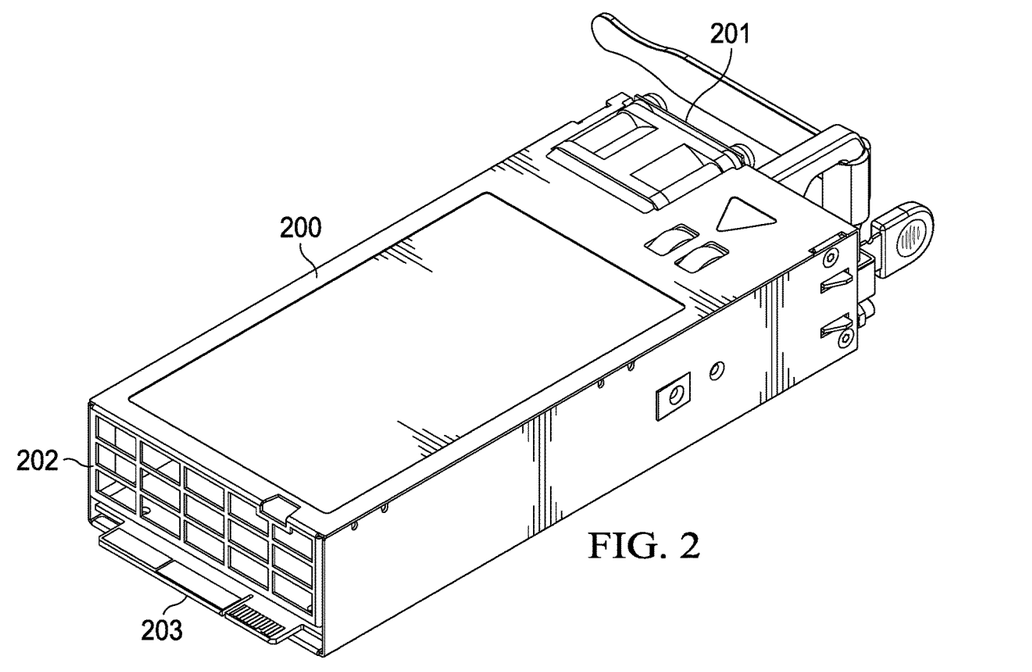
FIG. 2 is an illustration of an example of a first Power Supply Unit (PSU) having a first form factor, according to some embodiments.

FIG. 2 is an illustration of an example of first PSU 200 having a first form factor. In this example, PSU 200 is a redundant PSU having front end 201, rear end 202, and gold finger PCB connector 203. Upon assembly, redundant PSU 200 is inserted into a PSU cage within an IHS chassis, typically through the back of the chassis, with rear end 202 being inserted first and sliding into the cage. Upon insertion into the PSU cage, gold finger PCB connector 203 meets a matching connector of a Power Distribution Board (PDB), as shown in more detail in FIGS. 4A-C.

Figure 3:
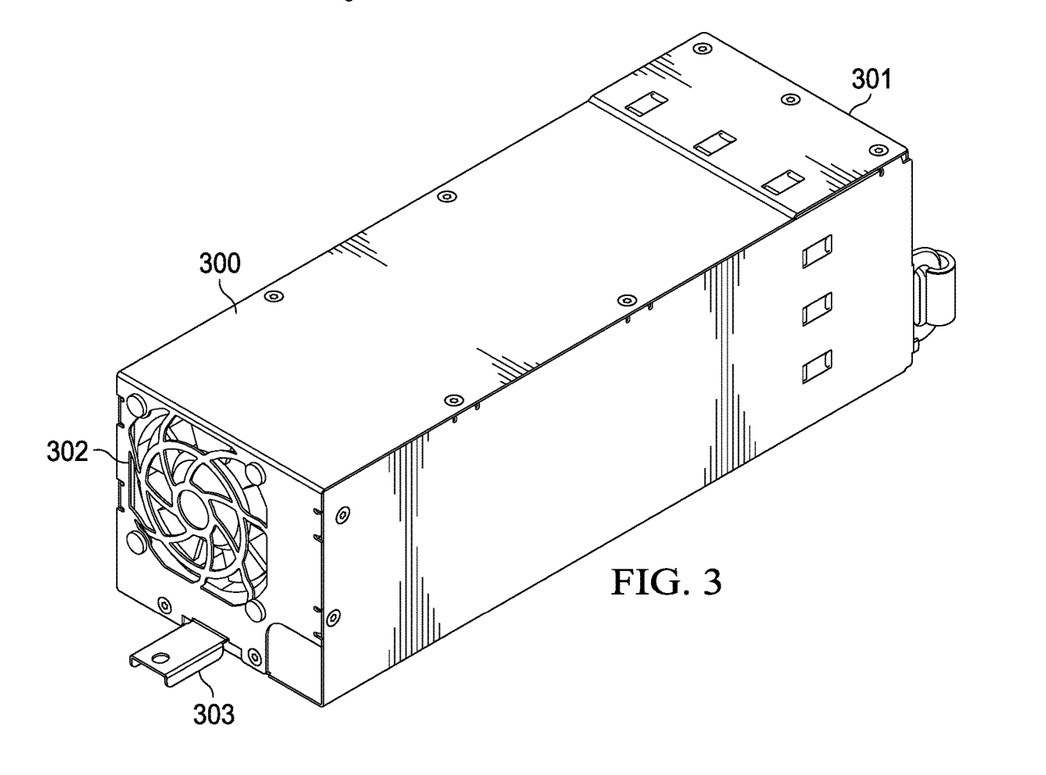
FIG. 3 is an illustration of an example of a second Power Supply Unit (PSU) having a second form factor, according to some embodiments.

FIG. 3 is an illustration of an example of second PSU 300 having a second form factor. In this example, PSU 300 is a cabled PSU having front end 301, rear end 302, and fastening bar 303. Upon assembly, cabled PSU 300 is inserted into a PSU cage within an IHS chassis, typically through the back of the chassis, with rear end 302 being inserted first and sliding into the cage. Unlike redundant PSU 200, cabled PSU 300 is connected to the IHS using cables, therefore cabled PSU 300 lacks a gold finger PCB connector and does not need a PDB. Upon insertion into the cage, fastening bar 303 meets a matching fastening point of the chassis, as shown in more detail in FIGS. 5A-C.

Figure 4A:
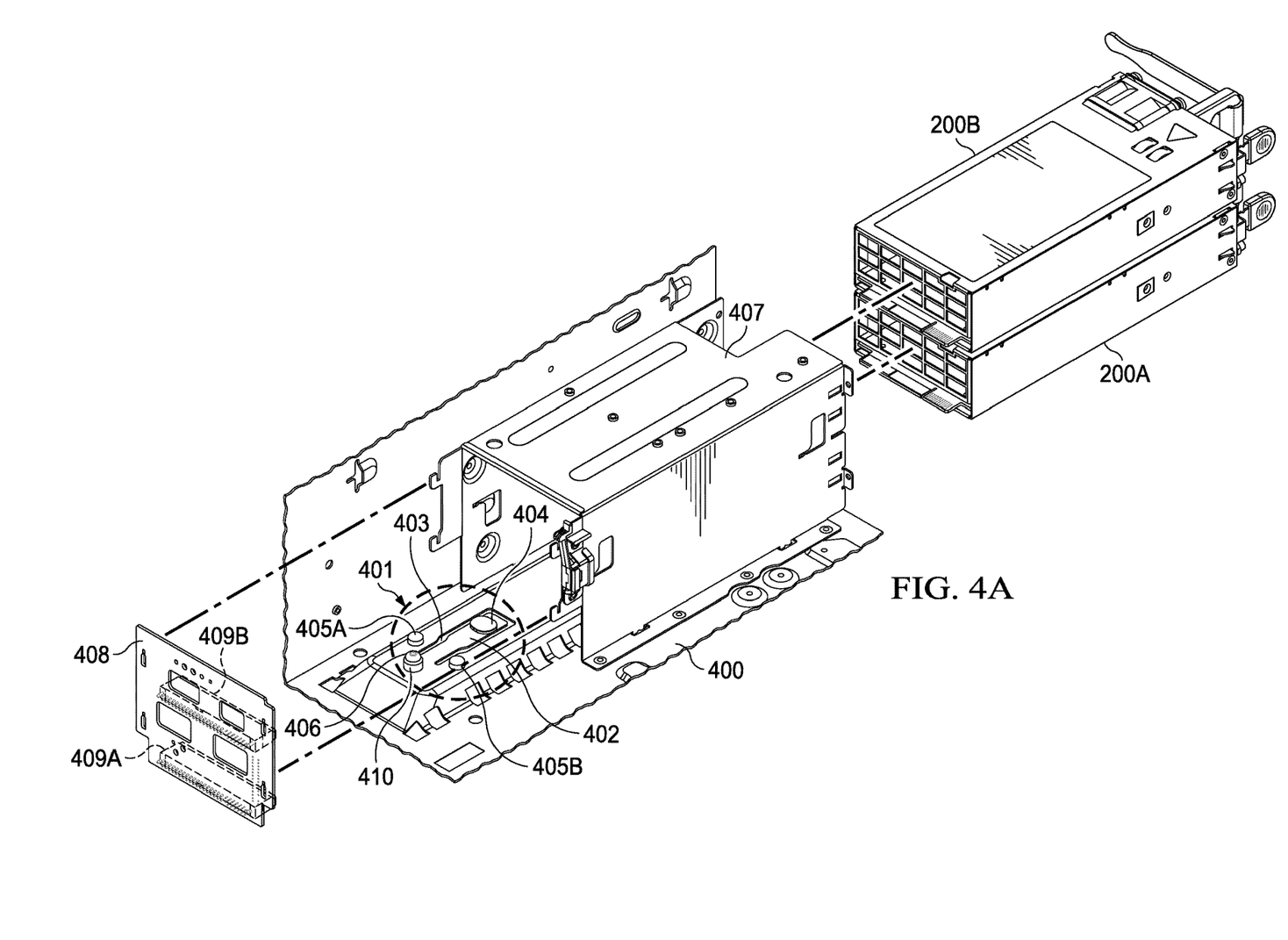
FIGS. 4A-C illustrate an example of a chassis having a flexible Power Supply Unit (PSU) bay configured to accommodate the first PSU, according to some embodiments.
Figure 4B:
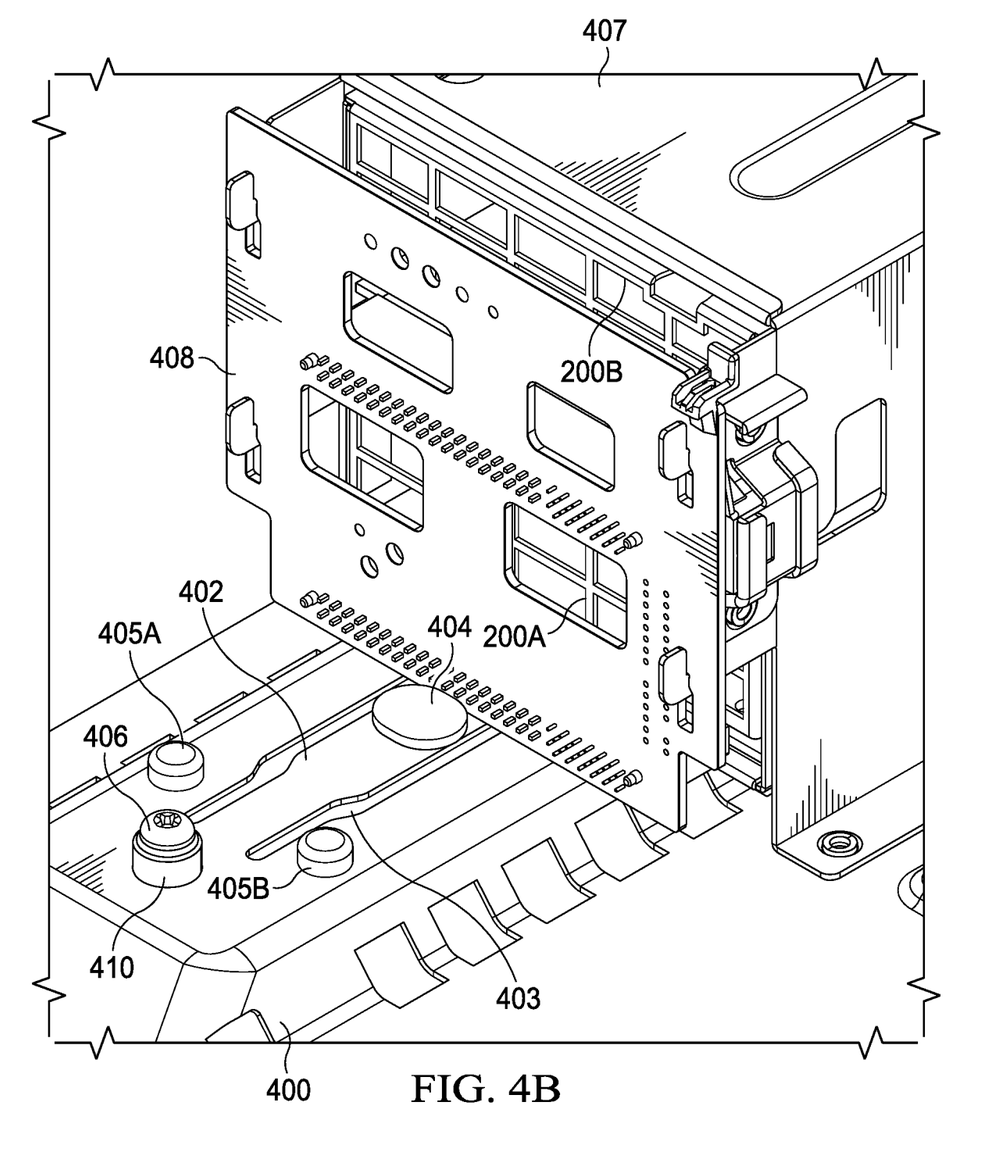
Figure 4C:
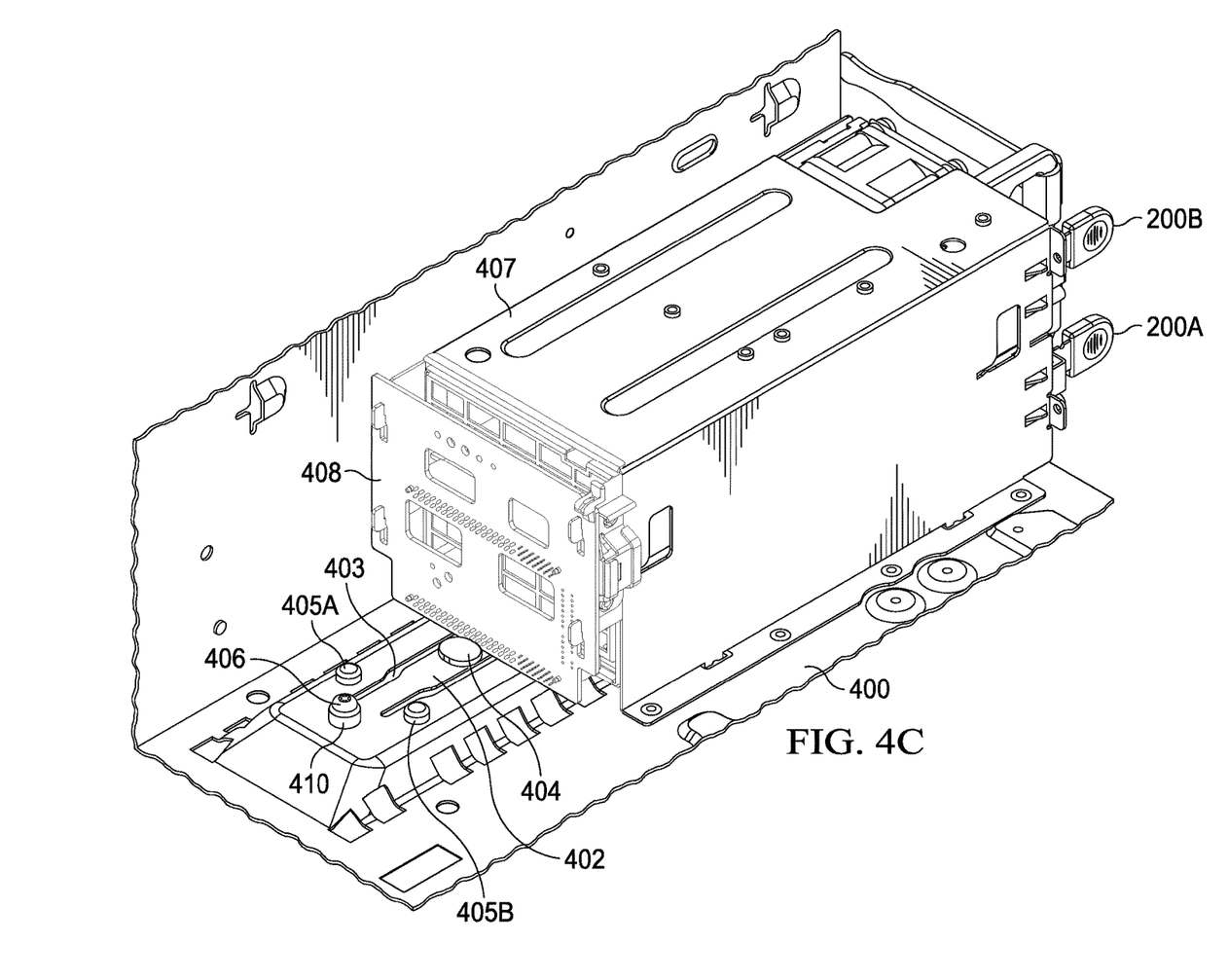

FIGS. 4A-C illustrate an example of a chassis having a flexible Power Supply Unit (PSU) bay configured to accommodate first PSU 200. In FIG. 4A, two redundant PSUs 200A and 200B are slidably inserted into PSU cage 407, and cage 407 is attached to chassis surface 400. PDB 408 is attached to the back of cage 407 and is perpendicular to chassis surface 400. In this case, PDB 408 includes connectors 409A and 409B configured to receive gold finger PCB connectors 203A and 203B, respectively.

Still referring to FIG. 4A, chassis surface 400 includes PSU adaptor 401. In various implementations, PSU adaptor 401 may include tab 402 defined by cutout 403, and stopper 404 mounted on tab 402. In some cases, PSU adaptor 401 may also include pins 405A and 405B and fastening point 410 (to which fastener 406 attaches), the operation of which is explained with respect to FIGS. 5A and 5B.

FIG. 4B shows PDB 408 attached to cage 407 and in contact (or close proximity, e.g., 1 mm or less) to stopper 404. As such, in response to redundant PSU 200A sliding into cage 407 such that gold finger PCB connector 203A meets PDB connector 409A, stopper 404 provides support to PDB 408 against bending, movement, or deformation in the horizontal direction. FIG. 4C shows both redundant PSUs 200A and 200B inserted into PSU cage 407, one stacked on top of the other.

Figure 5A:
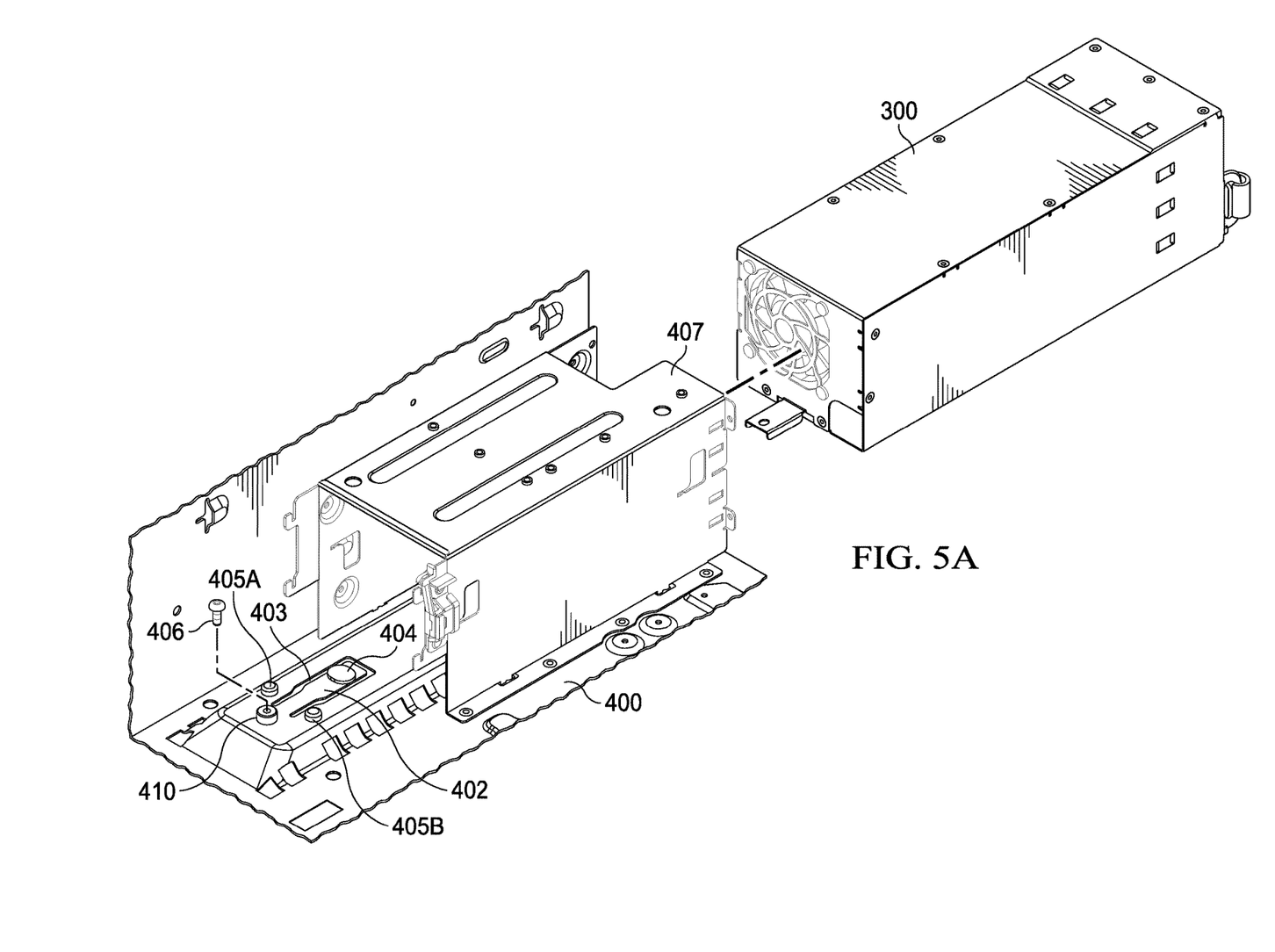
FIGS. 5A-C illustrate the example chassis having the flexible PSU bay configured to accommodate the second PSU, according to some embodiments.
Figure 5B:
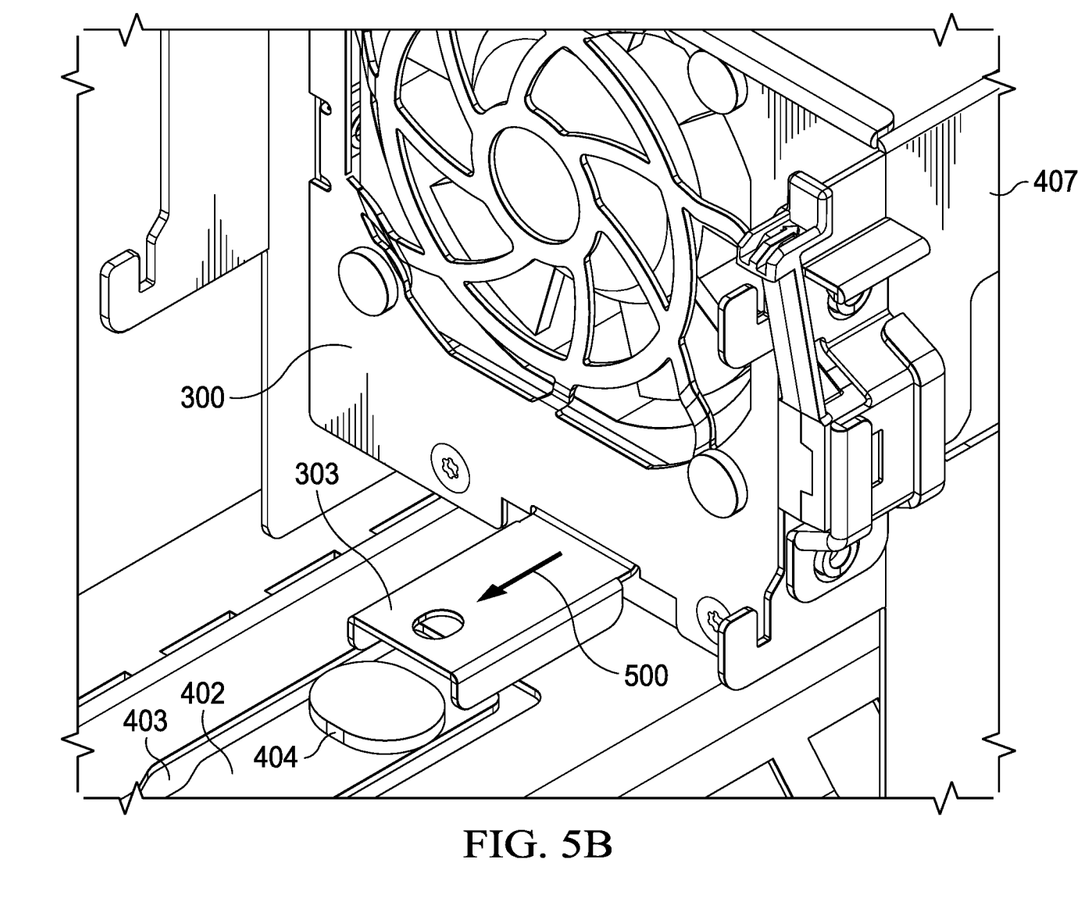
Figure 5C:
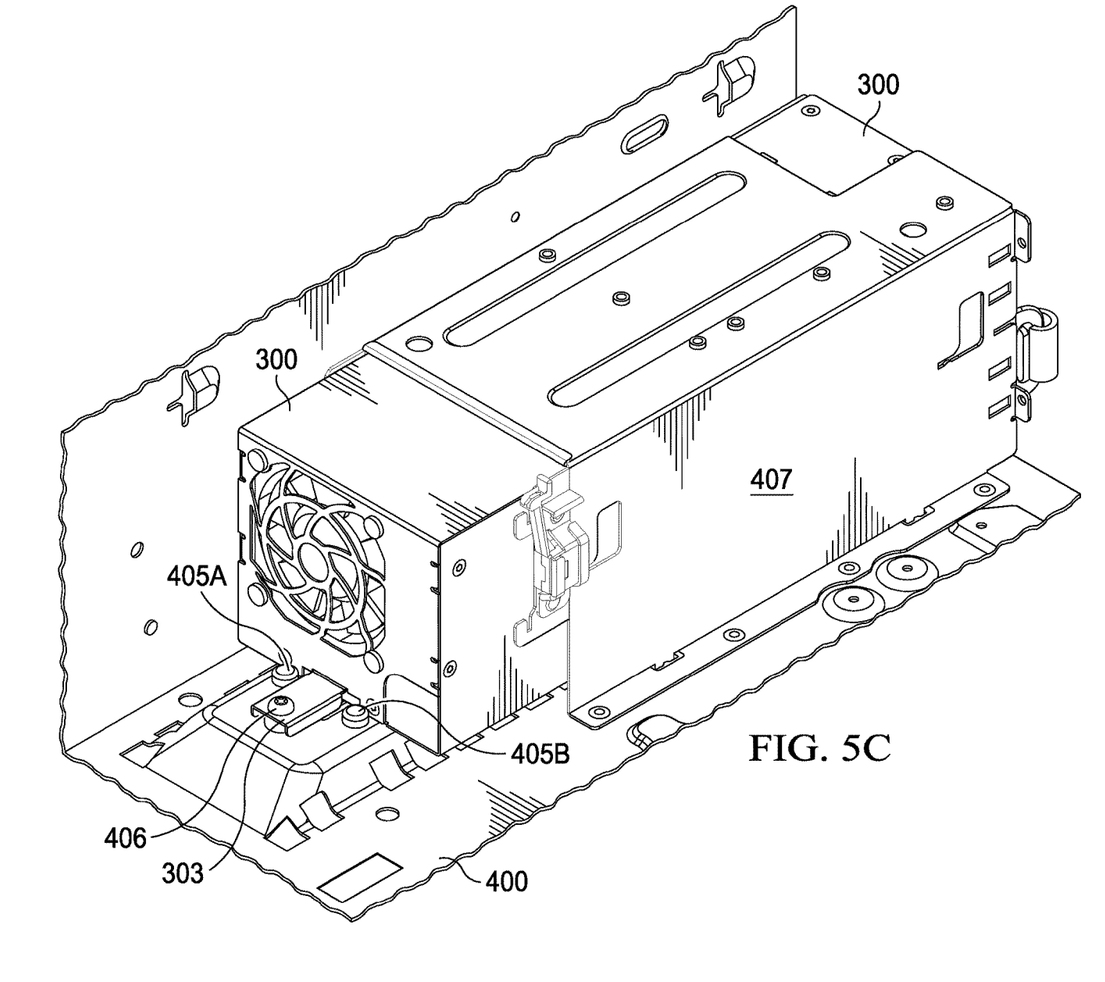

FIGS. 5A-C illustrate an example of a chassis having a flexible PSU bay configured to accommodate second PSU 300. In FIG. 5A, cabled PSU 300 is slidably inserted into PSU cage 407, and PSU cage 407 is attached to chassis surface 400. In this case, cabled PSU 300 includes fastening bar 303 configured to meet fastening point 410 upon assembly into cage 407, attachable to surface 400 using fastener 406.

As shown in FIG. 5B, upon insertion into PSU cage 407, fastening bar 303 of cabled PSU 300 pushes stopper 404 (and tab 402) downward until fastening bar 303 reaches the position where it attaches to fastening point 410 via fastener 406. In some cases, pins 405A and 405B stop the insertion of cabled PSU 300 into cage 407 at the location where fastening bar 303 meets fastening point 410.

Moreover, whereas tab 402 may be manufactured in metal or with the same material of the chassis, for example, by machining cutout 403 onto surface 400, stopper 404 may be made of plastic, rubber, or other electrically insulating material, therefore providing electrical insulation for PDB 408.

FIG. 5C shows cabled PSU 300 with its back resting against pins 405A and 405B. Fastening bar 303 is attached to fastening point 410 using fastener 406.

In various implementations, systems and methods described herein may provide a PSU adaptor that creates a flexible PSU bay. The PSU adaptor may include a cutout on an IHS chassis metal base or horizontal surface. This flexible structure allows both cabled and redundant PSU configurations to share one common chassis and PSU cage: (a) it works as a hard stop mechanism to provide support to PDB, preventing PDB deformation and movement while promoting a full engagement between a redundant PSU and PDB connector; and (b) it moves downward automatically to accommodate a cabled PSU that does not requires a PDB. A plastic extension (e.g., stopper 404) attached to the cutout (e.g., tab 402) may be used for short circuit prevention.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A chassis, comprising:
   a surface; and
   a Power Supply Unit (PSU) adaptor disposed on the surface, the PSU adaptor comprising a tab having a stopper coupled thereto, wherein the stopper is configured to: (a) resist movement, bending, or deformation of a board perpendicularly disposed with respect to the surface upon insertion of a first PSU into a PSU cage, and (b) move downward upon insertion of a second PSU into the PSU cage.

2. The chassis of claim 1, wherein the first PSU comprises a redundant PSU, and wherein the second PSU comprises a cabled PSU.

3. The chassis of claim 1, wherein the surface comprises a metal surface, and wherein the stopper comprises a plastic stopper.

4. The chassis of claim 1, wherein the second PSU comprises a fastening bar configured to push the tab and the stopper downward upon insertion of the second PSU into the PSU cage.

5. The chassis of claim 4, wherein the PSU adaptor further comprises at least one pin configured to stop the second PSU upon insertion into the PSU cage at a position where the fastening bar attaches to the surface.

6. The chassis of claim 4, wherein the stopper is configured to provide electrical insulation between the surface and the second PSU upon insertion into the PSU cage.

7. A Power Supply Unit (PSU) adaptor, comprising:
   a tab; and
   a stopper coupled to the tab, wherein the stopper is configured to: resist movement, bending, or deformation of a board upon insertion of a first PSU into a PSU cage, and move downward upon insertion of a second PSU into the PSU cage.

8. The PSU adaptor of claim 7, wherein the first PSU comprises a redundant PSU.

9. The PSU adaptor of claim 7, wherein the second PSU comprises a cabled PSU.

10. The PSU adaptor of claim 9, wherein the second PSU comprises a fastening bar configured to push the tab and the stopper downward upon insertion into the PSU cage.

11. The PSU adaptor of claim 10, wherein the PSU adaptor further comprises at least one pin configured to stop the second PSU upon insertion into the PSU cage at a position where the fastening bar attaches to a surface.

12. The PSU adaptor of claim 11, wherein the stopper is configured to provide electrical insulation between the second PSU and the surface upon insertion into the PSU cage.

13. An Information Handing System (IHS), comprising:
   a board; and
   a Power Supply Unit (PSU) adaptor coupled to the board, the PSU adaptor comprising:
      a tab; and
      a stopper coupled to the tab, wherein the tab and the stopper are configured to move downward upon insertion of a first PSU into a PSU cage, and wherein the stopper is configured to resist movement, bending, or deformation of the board upon insertion of a second PSU into the PSU cage.

14. The IHS of claim 13, wherein the first PSU comprises a cabled PSU.

15. The IHS of claim 14, wherein the first PSU comprises a fastening bar configured to push the tab and the stopper downward upon insertion into the PSU cage.

16. The IHS of claim 15, wherein the PSU adaptor further comprises at least one pin configured to stop the first PSU upon insertion into the PSU cage at a position where the fastening bar attaches to the surface.

17. The IHS of claim 16, wherein the stopper is configured to provide electrical insulation between the first PSU and the surface upon insertion into the PSU cage.

18. The IHS of claim 13, wherein the second PSU comprises a redundant PSU.

* * * * *